United States Patent [19]

Evans et al.

[11] Patent Number: 4,590,458

[45] Date of Patent: May 20, 1986

[54] OFFSET REMOVAL IN AN ANALOG TO DIGITAL CONVERSION SYSTEM

[75] Inventors: John T. Evans, Houston; Richard J. Kostelnicek, Dickinson, both of Tex.

[73] Assignee: Exxon Production Research Co., Houston, Tex.

[21] Appl. No.: 707,763

[22] Filed: Mar. 4, 1985

[51] Int. Cl.[4] .................... H03K 13/02; H03F 3/45
[52] U.S. Cl. .................... 340/347 AD; 340/347 CC; 330/259
[58] Field of Search .......... 340/347 AD, 347 CC, 340/347 SH; 330/259

[56] References Cited

U.S. PATENT DOCUMENTS

| | | | |
|---|---|---|---|
| 3,516,085 | 6/1970 | Dano | 340/347 AD |
| 3,636,463 | 1/1972 | Ongkiehong | 330/259 |
| 3,982,241 | 9/1976 | Lipcon | 340/347 CC |
| 3,988,689 | 10/1976 | Ochi et al. | 330/259 |
| 4,186,384 | 1/1980 | Acker | 340/347 AD |
| 4,280,196 | 7/1981 | Hornar et al. | 340/347 CC X |
| 4,282,515 | 8/1981 | Patterson | 340/347 CC |
| 4,301,421 | 11/1981 | Yokoyama | 330/259 X |
| 4,308,504 | 12/1981 | Ida | 330/253 |
| 4,356,450 | 10/1982 | Masuda | 330/259 X |
| 4,380,005 | 4/1983 | Debord et al. | 340/347 CC X |
| 4,395,681 | 7/1983 | Hornung et al. | 330/259 |

Primary Examiner—Vit W. Miska
Attorney, Agent, or Firm—E. Eugene Thigpen

[57] ABSTRACT

The invention is a system for reducing offset in an analog to digital conversion system. A signal representing the system offset is stored in digital form. A digital to analog converter generates an analog feedback signal in response to the stored digital signal. The output of the system analog to digital converter is periodically sampled to update the stored digital word representing system offset.

11 Claims, 6 Drawing Figures

OFFSET REMOVAL IN AN ANALOG TO DIGITAL CONVERSION SYSTEM

BACKGROUND OF THE INVENTION

1. Field of the Invention

This invention relates generally to analog to digital conversion systems and more particularly to a system for removing D.C. offset from a system for converting an analog seismic signal to a digital signal.

2. Description of the Prior Art

The use of analog to digital converter systems to produce a binary digital signal representative of the instantaneous value of an input analog voltage has long been known to the art. In systems used to convert an input seismic signal to a corresponding digital signal, the input signal is normally amplified to increase the signal amplitude prior to applying the signal to the analog to digital converter. Because the amplitude of the analog seismic signal can vary over a wide range, an amplifier is normally employed having a gain which is variable in binary increments. In such systems, a certain amount of DC offset can be expected to be present; that is, with a zero level input signal to the amplifier, the output signal from the digital to analog converter will be offset somewhat from zero. Even if compensation means are included in the system to adjust for offset at any given time, offset will reappear due to temperature changes, component drift and aging. Normally, such systems include elements to continually adjust for offset changes.

Such methods have included chopper stabilized amplifiers, such as disclosed in U.S. Pat. No. 3,988,689, issued Oct. 26, 1976 to Ochi et al. In these types of offset correction systems, the system offset is sampled and stored on a capacitor, and this stored voltage is then applied to subtract the offset from the succeeding amplified signal.

Other methods have included DC feedback around the amplifier, such as disclosed in U.S. Pat. No. 3,636,463 issued Jan. 18, 1972 to Ongkiehong. In such systems, a signal is taken from the output and fed back to the input to reduce offset. The feedback is passed back through a low pass filter to remove the AC component from the feedback.

Other systems employing DC feedback include U.S. Pat. No. 4,308,504, issued Dec. 29, 1981 to Ida and U.S. Pat. No. 4,301,421 issued Nov. 17, 1981 to Yokoyama. These systems use a signal derived from the DC offset voltage appearing at the output terminal to reduce the DC offset voltage. In the first instance, the collector-to-emitter voltages of two bipolar transistors are controlled. These bipolar transistors are connected in series with a differential pair of field effect transistors which comprise the input stage differential amplifier. Controlling the collector to emitter voltages of the bipolar transistors reduces the DC offset voltage. The second system is similar, except that the feedback varies the junction temperature or, alternatively, the voltage across the junctions, of transistors in the differential amplifier in accordance with the magnitude and polarity of an output offset voltage.

U.S. Pat. No. 4,395,681 issued July 26, 1983 to Hornung et al discloses a system in which the amplifier output is compared to a reference voltage in a comparator circuit. The output of the comparator controls an up/down counter, whose output controls a digital to analog converter. The digital to analog converter controls two current sources which vary the input level to the differential input to the amplifier to correct for offset.

U.S. Pat. No. 4,356,450 issued Oct. 26, 1982 to Masuda shows a system in which an offset correcting signal is generated while the circuit input is grounded. The output level is sampled and the count in an up/down counter is varied, depending on the polarity of the output signal. The digital output signal from the up/down counter is converted to a corresponding analog signal by a digital to analog converter and the output from the converter is applied to an input to the amplifier to correct for offset.

Also relevant is U.S. Pat. No. 3,516,085 issued June 2, 1970 to P. K. Dano. This patent discloses a system for shifting the amplitude of the signal which is applied to an analog to digital converter to enable an analog to digital converter having a given input range to encode a signal having variations which exceed that range. The output of the amplifier is continuously sampled by a threshold detector. When the input to the threshold detector exceeds a selected level in either a negative or positive direction, a counter control circuit causes a binary counter to count either up or down and the counter output controls an offset voltage control circuit which, in turn, controls a circuit which applies an offset voltage to the summing junction at the amplifier input to shift the signal amplitude so that it stays within the range of the analog to digital converter.

A primary disadvantage of the chopper stabilized systems is that they depend on a voltage level stored on a capacitor to effect the compensation, and the leakage which will occur from the capacitor will diminish the effectiveness and reliability of the feedback.

A primary disadvantage of the analog DC feedback systems is that the low pass filter will inherently delay the response time.

The systems employing feedback to vary junction temperature or collector-to-emitter voltage have inherent accuracy limitations.

The Hornung et al and Masuda systems utilize the stability of digital feedback, but these systems, like the other prior art systems, compensate for offset in the amplifier only.

The Dano system, while it uses circuitry similar to applicant's invention, is directed toward accomplishing a different objective.

Although systems for correcting for feedback in a binary gain amplifier are known, the prior art does not disclose a system for correcting for offset in the entire analog to digital conversion system; from input amplifier, through the sample and hold circuit and the analog to digital converter. Further, the prior art does not disclose a two step correction system in which a feedback signal is updated periodically to reduce steady state, or slowly varying, offset; and in which short term offset variations are compensated for by grounding the input following each data conversion cycle and generating a digital output signal representing any remaining offset not corrected for by the steady state feedback, and subtracting this offset digital signal from the previously generated digital output signal.

SUMMARY OF THE INVENTION

The invention is a method and apparatus for reducing offset error in a conversion system for generating an output digital signal representative of an analog signal applied to the input of said system. The converter system normally includes an amplifier, a sample and hold circuit and an analog to digital converter. A digital counter register stores a digital word representative of the offset which is present in all elements of the conversion system. This representative digital word is converted to an equivalent analog feedback signal which is combined with the input analog signal to reduce the offset present in the output digital word substantially to zero. At selected intervals, signal ground is applied to the system input, rather than the analog signal input. The system is then operated to generate an output digital word, which will reflect the remaining offset present in the system. The stored digital word representative of the system offset is then updated in response to the output digital word so as to further reduce the offset.

In a preferred embodiment of the invention, there is included a register for temporarily storing the digital word generated by the system while the analog input signal is applied to the system input. A second digital word is then generated with signal ground connected to the input of the system. This second digital word, representing the remaining offset present in the system, is subtracted from the digital word temporarily stored in a register to generate the system digital output, thereby further diminishing any offset error component present in the system digital output signal. This second digital word is also the signal normally utilized to update the stored digital word representative of the system offset.

DESCRIPTION OF THE PREFERRED EMBODIMENT

Figure 1:
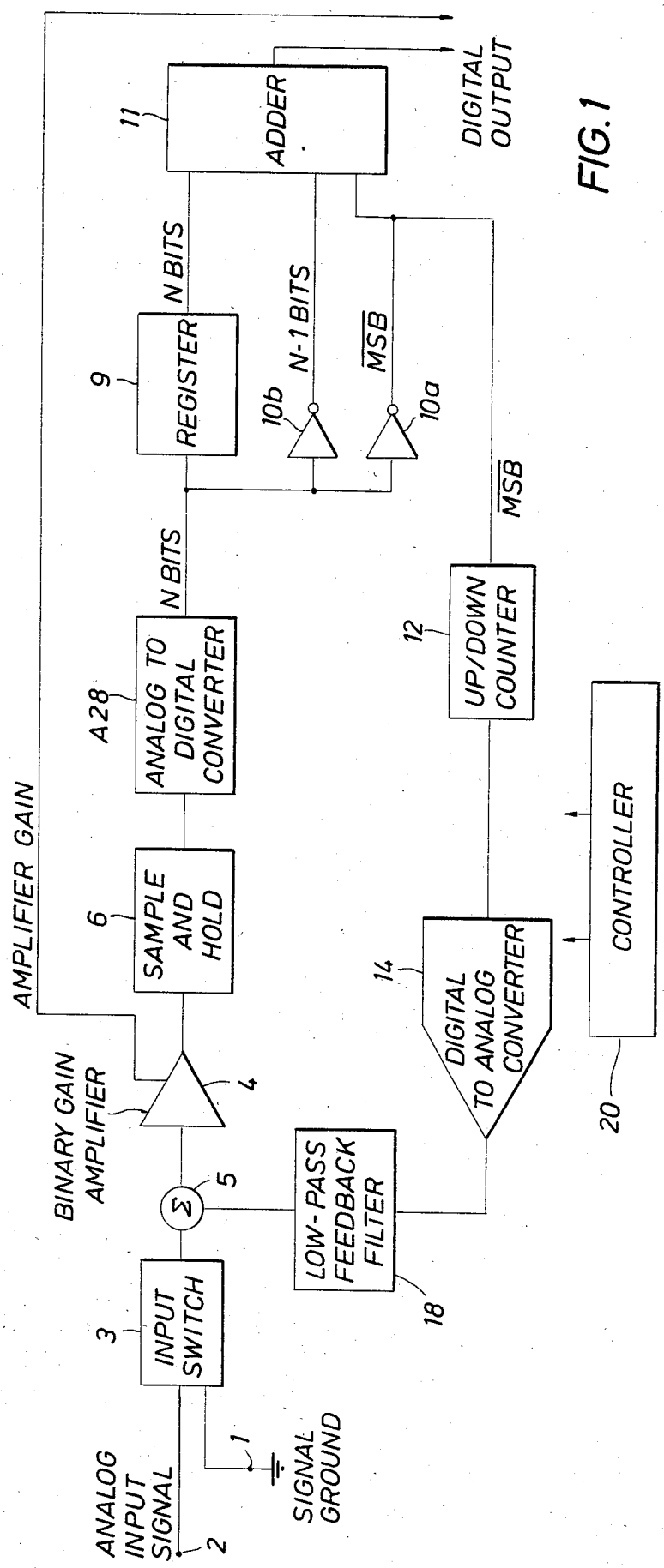
FIG. 1 is a block diagram of a preferred embodiment of the invention.

FIG. 1 shows a block diagram of a preferred embodiment of the invention. The invention comprises a system for generating digital output signals representative of the amplitude of an input analog signal. The input signal may be a seismic data signal generated during geophysical exploration, but the input signal could also be representative of other types of data. The system includes means for generating a feedback signal representative of the system offset and for subtracting the feedback signal from the analog input signal in order to reduce the system offset error in the digital output signals.

Referring to FIG. 1, the input analog signal at terminal 2 is passed through input switch 3, the function of which will be explained later, then combined with the feedback signal output from low pass filter 18 before being applied to binary gain amplifier 4.

If the input analog signal is a seismic signal, the amplitude of the signal reflected from deep subsurface interfaces may be less than the amplitude of the signal reflected from shallow subsurface interfaces by several orders of magnitude. For such a signal, it is desirable to use an amplifier whose gain can be varied as a function of the input signal amplitude, such as the type of amplifier, frequently used in seismic data gathering systems, whose gain is variable in increments of powers of two. For systems used for amplifying other data, it may be less important that the gain of the amplifier be variable.

The output of binary gain amplifier 4 is applied to sample and hold circuit 6 which, at selected intervals, samples the input signal thereto and "holds" this sampled level to enable analog to digital converter circuit A28 to generate a digital signal representative of the analog signal level at the sample and hold output. This output of the analog to digital converter may be utilized as the system output, or a secondary offset correction may be made as will be explained later. The system output digital word will also include data from the binary gain amplifier, representing the gain setting of the binary gain amplifier during the encoding cycle.

The primary offset correction is made by combining the feedback signal output from low pass filter 18 with the input data signal, as explained above. This feedback signal is generated as follows. Up/down counter 12 is a register holding a digital word, the value of which may be increased or decreased as a function of the control signals thereto. Up/down counter 12 stores, in digital form, the feedback needed to correct for system offset. The up/down counter output is applied to digital to analog converter 14 where the digital signal is converted to an equivalent analog signal and then passed through low pass filter 18 before being combined with the data input signal.

In the preferred embodiment, the count in up/down counter 12 is preset at a selected value, which may be half scale. Then, at selected times, which may be periodically following data encoding cycles, input switch 3 is controlled so that signal ground is combined, via summing junction 5, with the output from low-pass filter 18 and applied to binary gain amplifier 4. The term "encoding cycle", as used herein, refers to an operation of analog to digital converter A28 to generate a digital output representative of an analog input. With the input switch in this position, an encoding cycle is initiated. If the feedback signal at the low pass filter output is at the appropriate amplitude, the digital output signal from analog to digital converter A28 will be substantially equal to zero.

The most significant bit (the sign bit) of the digital word generated by analog to digital converter A28 is inverted by inverter 10a and applied to the up/down counter. The count in up/down counter 12 is either increased or decreased to change the amplitude of the offset feedback signal in the direction to diminish any remaining offset in the analog to digital converter output. In the preferred embodiment described herein, the count in the up/down counter will always be changed by a count of one at each updating cycle, so that if the feedback signal at the output of low-pass filter 18 approaches the precise amount of feedback needed to remove all offset from the system, the count in the up/down counter will be alternately increased and decreased during successive updating cycles.

When power is initially applied to the system and encoding operations begun, the count in up/down counter 12 may be substantially different from the count required to generate the needed feedback signal amplitude. Therefore, a number of updating cycles will be required to change the count in the up/down counter to the appropriate value.

The offset feedback signal is intended to correct for system offset which is essentially steady state or slowly varying. In the particular preferred embodiment described herein, a further offset correction is made following each data encoding cycle. The digital word generated by the analog to digital converter while switch 3 is in its normal encoding position is not used as the system output. Instead, the digital word so generated is stored temporarily in register 9. Input switch 3 is then changed so that signal ground is transferred to its output, rather than the analog input signal, and an additional encoding cycle is initiated. If the offset feedback signal at the output of low-pass filter 18 is at the precise level needed to correct for system offset, then the digital word generated by the analog to digital converter will have zero value. To the extent that system offset has not been precisely corrected for, the digital word generated by the analog to digital converter represents the residual offset. This digital word is then inverted by inverters 10a and 10b, and combined, in adder 11, with the digital data signal which has been stored temporarily in register 9. The digital output from adder 11 is then utilized as the system digital output.

The digital output from adder 11 will then have had two corrections for offset; one correction for steady state system offset and one for removing any residual offset which might not have been removed by the offset feedback. The most significant bit (MSB) of the digital word generated by the analog to digital converter while signal ground is transferred to the input switch output is the signal utilized to update the count in up/down counter 12, as explained previously.

Figure 6:
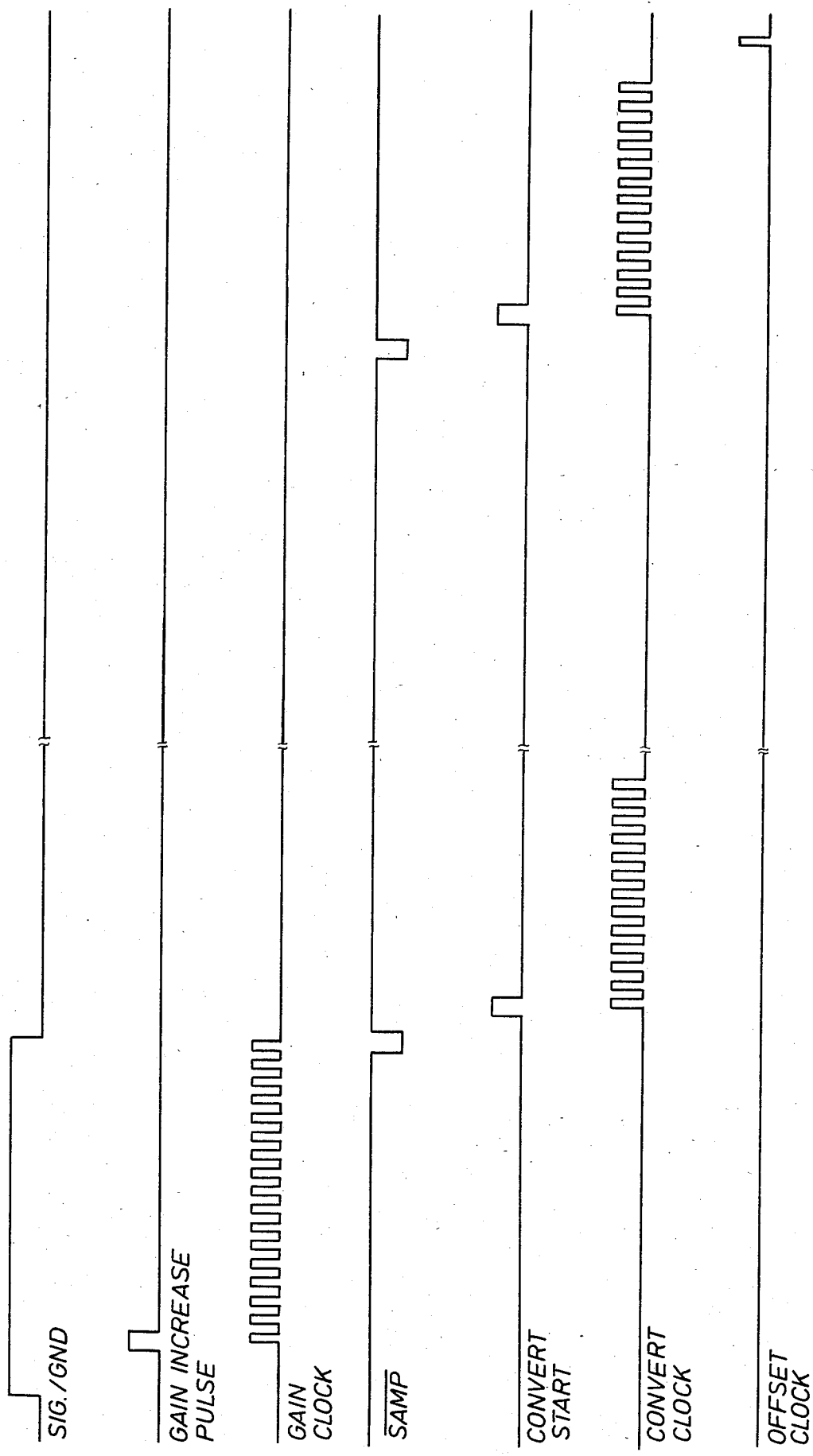
FIG. 6 shows the timing relationship between certain system control waveforms.

The system operates in response to control signals from a Controller, designated in FIG. 1 as Controller 20. The more significant signals from the Controller may be as shown in FIG. 6. The Controller does not form a part of this invention. One of ordinary skill in the art would understand how to generate signals having such waveforms. One of ordinary skill in the art would also understand that particular embodiments of the invention might require variations from the waveforms shown.

Figure 2:
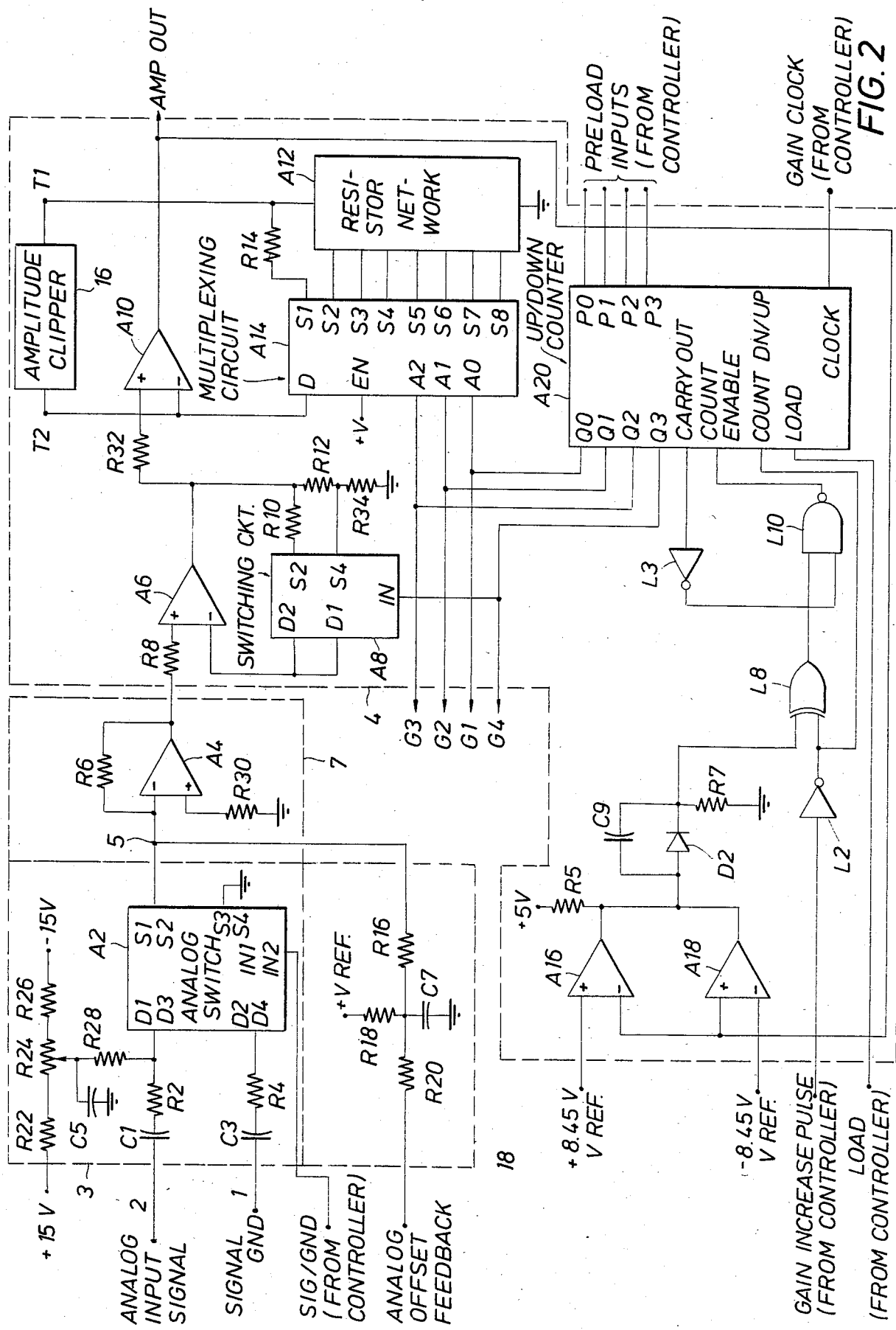
FIG. 2 is a more detailed schematic of the feedback filter, input switch and binary gain amplifier shown in block diagram in FIG. 1.

The invention is described in more detail with reference to FIGS. 2-6. Referring to FIG. 2, the system analog input signal is applied to terminal 2. To remove DC offset which may already be present in the signal at this point, the analog input signal is AC-coupled through capacitor C1 to an input of analog switch A2. For reasons which will be further discussed hereinafter, a second input to analog switch A2 is connected, through capacitor C3, to signal ground. Depending on the state of the SIG/GND control signal generated by Controller 20 and applied to analog switch A2, either the analog input signal or AC ground is applied through resistor R2 or R4, respectively, and through the analog switch to the (−) terminal of amplifier 7. Referring to FIG. 6, when the SIG/GND signal is high, the analog input signal is transferred to the input switch output, and when the SIG/GND signal is low, the signal ground signal is transferred to the switch output. The resistor R6 is selected to have the same value as resistors R2 and R4 so that amplifier 7 will have unity gain. The offset feedback signal, applied to amplifier A4 through resistor R16, is combined with the analog input signal at summing junction 5. The network consisting of R22, R24, R26, R28 and C5 is utilized to correct for any initial offset in analog switch A2. Analog switch A2 may be the DG290AP Analog Switch made by Siliconix. Amplifier A4 may be the OPA111BM operational Amplifier made by Burr-Brown.

For simplicity in illustration, amplifier 7 is represented on FIG. 1 as summing junction 5.

The output of amplifier 7 is applied to the first stage of binary gain amplifier 4. The first stage of binary gain amplifier 4 includes amplifier circuit A6 and switching circuit A8. The values of resistor R12 and R34 are selected to achieve an amplification in this stage of either unity or 256, depending on the state of switching circuit A8. Resistors R8 and RIO are chosen to minimize bias current induced offset error. The control signal to terminal IN of switching circuit A8 determines whether the feedback from the output terminal of amplifier circuit A6 is applied through R10 to the (−) input terminal of amplifier circuit A6 or whether the output is applied through R12 to the (−) input terminal. If the output is applied through R10, the amplifier gain will be unity, and if through R12, the gain will be 256. Amplifier A6 may be an OP-27FZ Operational Amplifier made by Precision Monolithics Incorporated (a Bourns subsidiary). Switching circuit A8 may be a DG243 Dual SPDT CMOS switch made by Siliconix.

The output from the first stage of the binary gain amplifier is applied to the input of the second stage, which includes amplifier circuit A10, resistor network A12 and multiplexing circuit A14. The value of the resistors in resistor network A12 may be selected so the second stage of the binary gain amplifier will have a gain which varies in binary increments between unity and 128 (i.e. 1, 2, 4, 8, 16, 32, 64 and 128). Resistor networks suitable for use as resistor network A12 may be obtained from Vishay Incorporated. Resistors R32 and R14 are chosen to minimize bias current induced offset error. The gain of the second stage of the binary gain amplifier will depend on the state of multiplexing circuit A14 which is controlled by the state of the signals on control terminals A0, A1 and A2. The gain of the first and second binary gain amplifier combined is, therefore, variable in binary increments between unity and 32,768.

Figure 3:
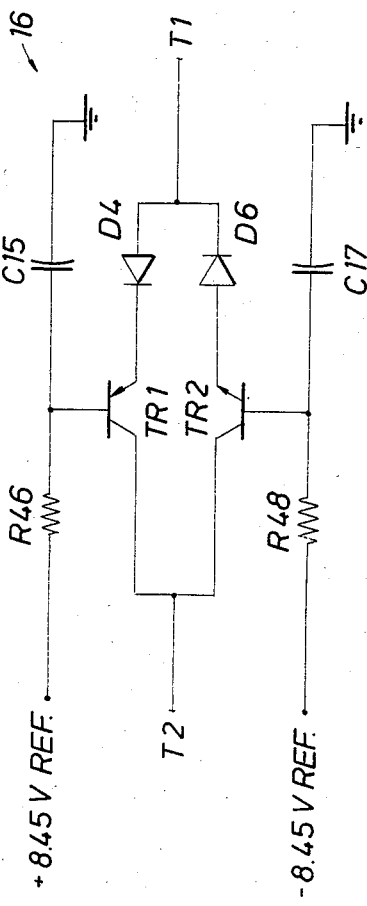
FIG. 3 is a schematic drawing of the amplitude clipper shown in FIG. 3.

Amplitude clipper 16 may take the form shown in more detail in FIG. 3. The function of amplitude clipper 16 is to prevent amplifier A10 from going into hard saturation, which would result in slowing of the binary gain amplifier response time.

The output from the second stage of the binary gain amplifier is applied to comparator circuits A16 and A18, to the (−) input terminal of A16 and the (+) input terminal of A18. Reference voltages are applied to the (+) input terminal of comparator A16 and to the (−) input terminal of comparator A18. The voltage reference levels may vary depending on the particular system design; but in the preferred embodiment were selected to be +8.45 volts and −8.45 volts, respectively, because the input range of the analog to digital converter is ±10 volts. The output terminals of comparators A16 and A18 are connected together. The network comprising resistors R5 and R7 and diode D2 and the amplitude of voltage (+V) applied to resistor R5 are selected so that the comparator circuits output applied to the input of exclusive-or gate L8 is at approximately +5 volts when the output signal from the binary gain amplifier circuit is within the range between −8.45 volts and +8.45 volts, and goes to approximately 0 volts when the signal is outside that range.

As shown in FIG. 6, seventeen GAIN CLOCK pulses are generated by the Controller during an analog input data encoding cycle. While the GAIN IN-CREASE PULSE signal is at a high level, the GAIN CLOCK pulse occurring at that time will cause the count in up/down counter A20 to increase if the binary gain amplifier output is within the range between −8.45 volts and +8.45 volts. After the GAIN INCREASE PULSE goes to the low state, up/down counter A20 is permitted to count down but not up, and the counter will count down at each GAIN CLOCK pulse, but only if the binary gain amplifier output (AMP OUT) is outside the range of −8.45 volts to +8.45 volts.

The state of the output from terminals Q0, Q1, Q2, and Q3 of up/down counter A20 determine the gain of the binary gain amplifier. These outputs are applied to the A0, A1 and A2 terminals of multiplexing circuit A14 and the IN terminal of switching circuit A8 to select the resistance value in the feedback for amplifiers A6 and A10, and thereby control the gain.

The binary gain amplifier may also be operated in a fixed gain mode by applying appropriate Preload Input signal levels to the P0, P1, P2 and P3 terminals of Up/down counter 20 and applying a LOAD signal to the LOAD terminal. Both the Preload Input and LOAD signals are normally generated by the Controller. It may be desirable, for testing purposes, to operate the amplifier in fixed gain mode.

Amplifier A10 may be an OP-27FZ Operational Amplifier made by Precision Monolithics Incorporated. Multiplexing circuit A14 may be an MUX08 Eight Input Bifet Multiplexer made by Precision Monolithics Incorporated. Up/down counter A20 may be a 74HC191 Presettable 4-Bit Binary Up/Down Counter made by Motorola. Comparators A16 and A18 may be LM293H Voltage Comparators made by National Semiconductor. The other components may be selected by one of ordinary skill in the art from a number of components having suitable temperature and other characteristics.

The output signal (AMP OUT) from binary gain amplifier 4 is applied to sample and hold circuit 6. The sample and hold circuit, shown in detail in FIG. 4, includes sample and hold chip A24 and capacitor C11.

Sample and hold chip A24 may be an SMP10BY Sample and Hold Amplifier made by Precision Monolithics Incorporated. Capacitor C11 should be a temperature stable, low leakage capacitor with low dielectric absorption such as a 0.005 microfarad polystyrene capacitor.

As shown in FIG. 6, the $\overline{\text{SAMP}}$ signal from the Controller goes to its low state when the gain ranging of the binary gain amplifier is completed. This $\overline{\text{SAMP}}$ signal, which is applied to terminal S/H of the sample and hold chip, functions to transfer the voltage level at the INPUT terminal of the sample and hold chip to the OUT terminal to which capacitor C11 is connected via a buffer amplifier inside the chip. After the $\overline{\text{SAMP}}$ signal returns to its high state, the sampled input signal level continues to be "held" by capacitor C11 for a time sufficient for the analog to digital converter to generate an equivalent digital signal. The circuit including resistors R40 and R44, potentiometer R46 and capacitor C13 is utilized so that the voltage applied to the (+) terminal of amplifier A26 may be adjusted to compensate for offset which may be present within the digitizer. Amplifier A26, which may be an OP221 Operational Amplifier made by Precision Monolithics Incorporated, is a unity gain inverting buffer.

The output from sample and hold circuit 6 is applied to the input of analog to digital converter A28, which may be an MN5252E twelve Bit A/D Converter made by Micro Networks, of 324 Clark St., Worcester, Mass.

Analog to digital converter A28 converts the analog signal present at the ANALOG INPUT terminal thereof to an equivalent 12 bit digital word. The input analog signal is digitized in response to the CONVERT START and CONVERT CLOCK signals from the Controller, which may have the waveforms shown in FIG. 6. As stated previously, the analog to digital converter output, together with the signals from the binary gain amplifier which indicates the gain of the amplifier (G1, G2, G3 and G4), may be utilized as the system output.

Figure 4:
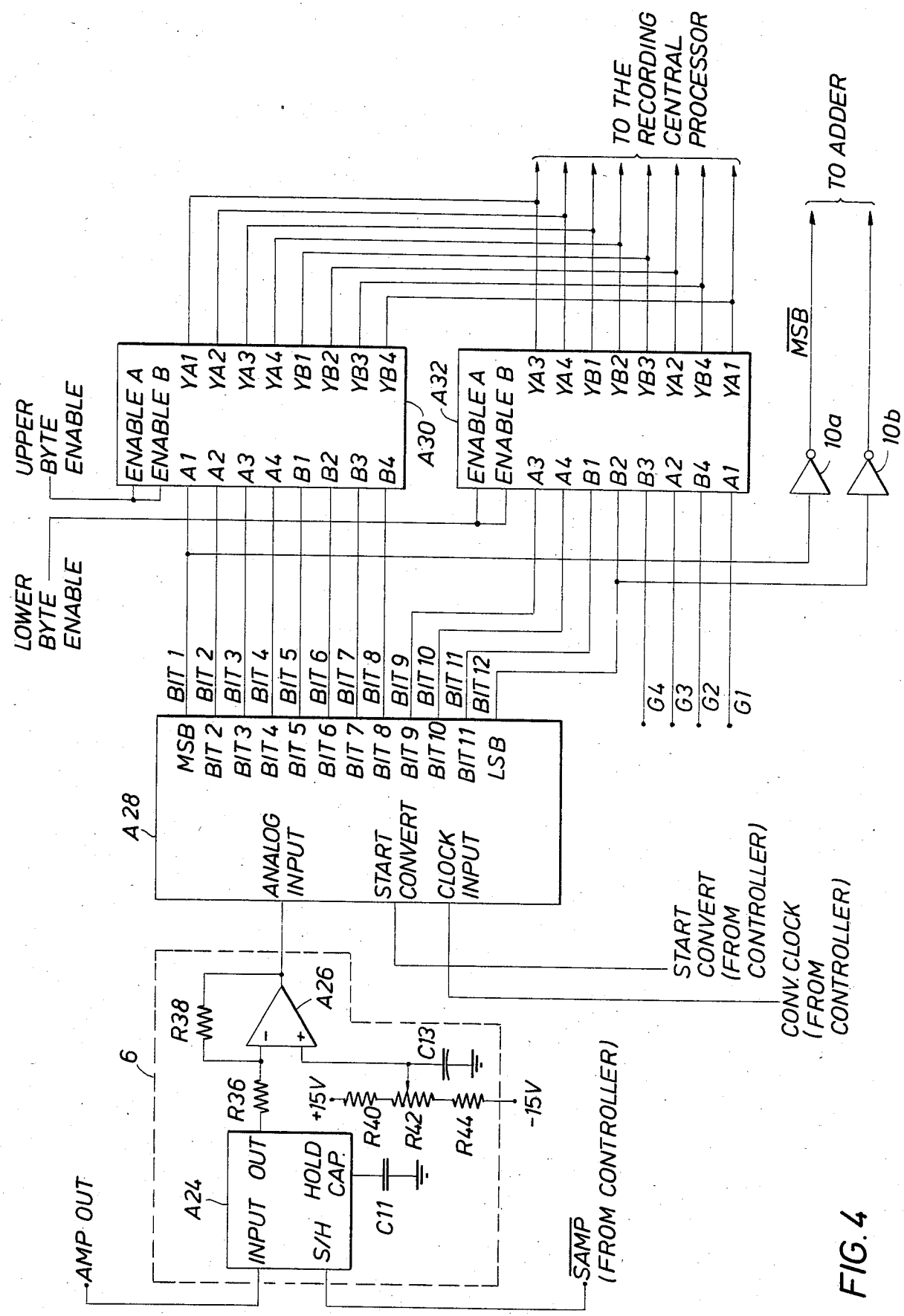
FIG. 4 is a more detailed schematic of the sample and hold circuit and analog to digital converter shown in block diagram in FIG. 1.

It may be desirable to buffer the system output to interface with a recording central processor or other interface systems. As shown in FIG. 4, eight bits of the output digital word are applied to data bus driver A30 and four bits are applied to data bus driver A32. The four gain bits (G1, G2, G3 and G4) from binary gain circuit 4 are also applied to data bus driver A32. The outputs from buffers A30 and A32 are connected together in pairs. The buffer outputs are tri-state outputs and the Lower Byte Enable and Upper Byte Enable signals, which are generated by the Controller, will sequentially control the buffers so the data from each is sequentially placed on the output terminals. Buffers A30 and A32 may be 74HC244 Noninverting Line Drivers made by Motorola. The buffers are not a part of the offset correcting system and are not shown in FIG. 1.

Following completion of the data encoding cycle, a second encoding cycle is initiated to update the offset feedback, and if desired, to generate a digital word representing residual system offset to subtract from the data word generated during the data encoding cycle.

With the SIG/GND signal from the Controller at its low state, the signal ground is transferred to the output of input switch 3. As shown in FIG. 6, the $\overline{\text{SAMP}}$, CONVERT START and CONVERT CLOCK signals are repeated to perform a second encoding cycle; however, the GAIN INCREASE PULSE and GAIN CLOCK signals are not repeated. The result is that the binary gain amplifier remains at the same gain value as during the input data encoding cycle.

Figure 5:
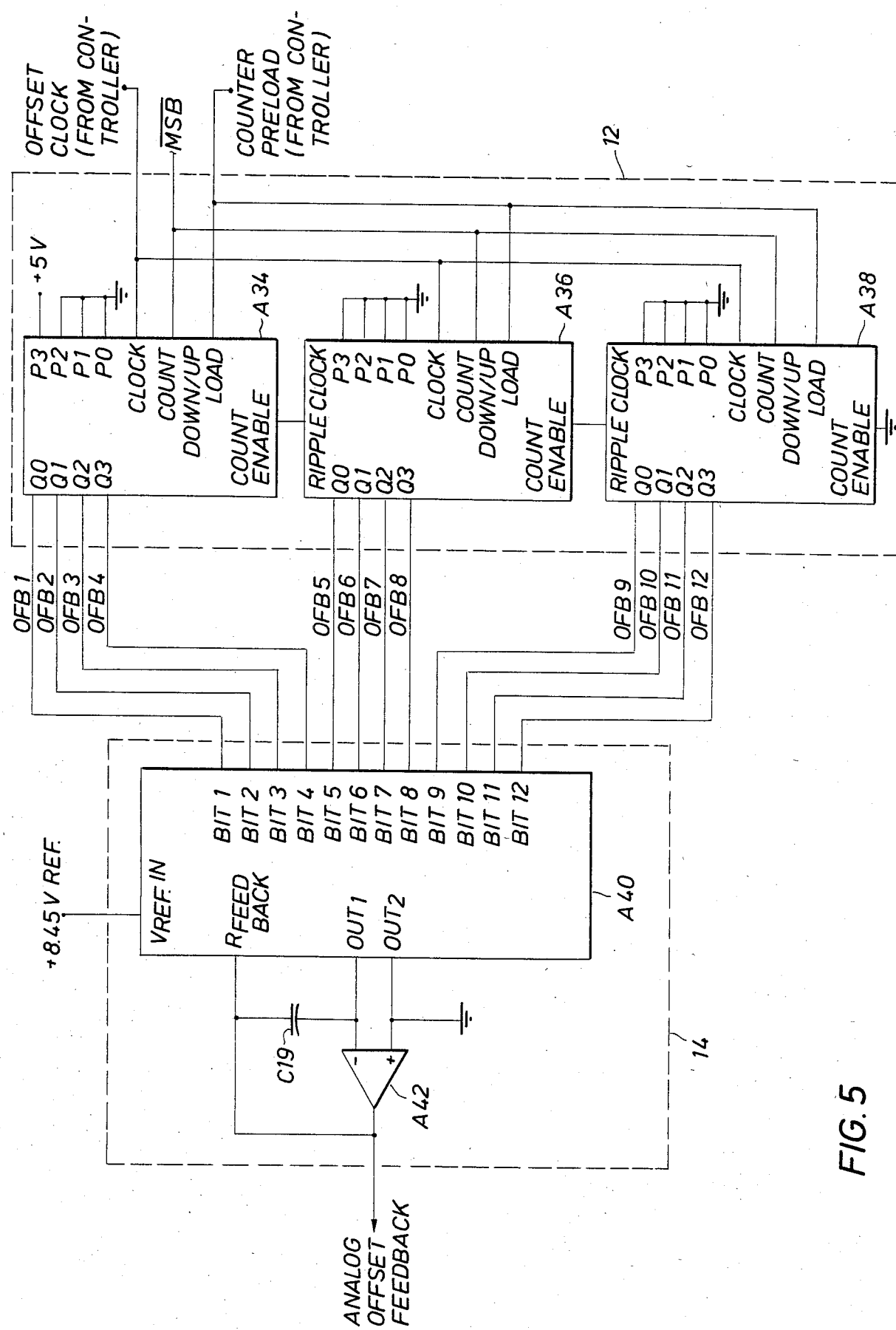
FIG. 5 is a more detailed diagram of the up/down counter and digital to analog converter shown in block diagram in FIG. 1.

As also stated previously, the most significant bit of the offset word (the analog to digital converter output generated during this second encoding cycle), which is the sign bit representing whether the word is positive or negative, is utilized to update the offset feedback signal. The sign bit is inverted by inverter 10a and the inverted signal ($\overline{\text{MSB}}$) is applied to the COUNT DOWN/UP terminals of Counters A34, A36 and A38, as shown in FIG. 5. Counters A34, A36 and A38, which may be 74HC191 Presettable 4-Bit Binary Up/Down Counters made by Motorola, are interconnected to form a 12 bit up/down counter. The digital output of this up/down counter is then converted to an equivalent analog signal level by digital to analog converter 14, which includes an AD7541AAQ 12-Bit Monolithic Multiplying DAC made by Analog Device and a TL062IP Operational Amplifier made by Texas Instruments, Inc.

If the $\overline{\text{MSB}}$ signal is high, indicating that the amplitude of the feedback signal is lower than is needed to remove system offset, the count in up/down counter 12 is decreased so as to increase the amplitude of the feedback signal. (The gain is decreased to increase the amplitude of the feedback signal because digital to analog converter 14 is an inverting device.) If the MSB signal is low, the feedback signal is too high and the count in the up/down counter is then increased. In the preferred embodiment, the count in up/down counter 12 is changed by only one count during each updating cycle. The count in up/down counter 12 is changed in response to the OFFSET CLOCK signal from the Controller which, as shown in FIG. 6 is generated following completion of the offset word encoding cycle.

Before initiating encoding operations, it may be desirable to preset up/down counter 12 to a selected count. With the +5 volt signal applied to the P3 terminal of counter A34 as shown, when the Counter Preload signal from the Controller is applied, which normally happens after the system is powered up, up/down counter 12 will be set to half scale, Therefore, a number of digitizing cycles will be required before the count in the up/down counter 12 reaches an appropriate value.

The output from analog to digital converter A40 is buffered by amplifier A42, which may be a TL062IP Dual Op Amp made by Texas Instruments, and applied to low pass filter 18. Amplifier A42 converts the current signal output from digital to analog converter A40 to a voltage signal. Capacitor C19 is a smoothing capacitor to reduce signal ripple.

The offset feedback signal output from amplifier A42 is passed through low pass filter 18, shown in detail on FIG. 2, where it is filtered to reduce amplitude fluctuations and attenuated as needed by properly selecting the values of resistors R20, R16, R18 and R6 to generate a feedback signal having a voltage range compatible with the system.

As explained previously, a further offset correction may be made to the digital output data by subtracting the value of the digital word generated by the analog to digital converter during the second encoding cycle just described (the offset word) from the digital data word generated by the analog to digital converter during the first described encoding cycle. If such a correction is desired, the digital data word is stored temporarily in register 9, which may include two 74HC175 Six Input Registers made by Motorola. The output of register 13 is applied to one set of inputs to adder 11. Adder 11 may include three 74LS283 Four Bit Full Adders made by Motorola.

When the second encoding cycle generates the offset word, the offset word is inverted and applied to the second set of inputs to adder 11. Although only two inverters are shown in FIGS. 1 and 4, it is understood that each of the twelve bits from the analog to digital converter output would be passed through a separate inverter. In the preferred embodiment described herein, a twelve bit analog to digital converter is used and the "N" symbol at the output thereof represents the number twelve. The output of adder 11, then, yields a system output having two stages of offset correction. The internal structure of register 9 and adder 11 are well known to those skilled in the art and is not illustrated in detail herein.

The step of subtracting the offset word from the data word may also be performed by software. If software is used to perform the subtraction, the digital data word generated by analog to digital converter A28 during the first encoding cycle is transferred into computer storage. When the offset word generated by the analog to digital converter during the second encoding cycle is generated, it is also transferred to the computer, which does the subtraction. Methods of utilizing software to subtract two signals are well known to those of ordinary skill in the art.

Buffers, such as buffers A30 and A32 may be utilized as shown in FIG. 4 between the analog to digital converter and the recording central processor (computer). If subtraction of the offset word from digital data word is performed with hardware as shown in FIG. 1, then such buffers might normally be used between the adder and the recording central processor.

Various modifications and alterations in the practice of this invention will be apparent to those skilled in the art without departing from the scope and spirit of this invention. Although the invention was described in connection with specific preferred embodiments, it should be understood that the invention as claimed should not be unduly limited to such specific embodiments.

We claim as our invention:

1. A method of reducing offset error in a conversion system for generating an output digital signal representative of an analog signal applied to the input of said system comprising:
   storing in a register a first digital signal representative of the offset in the system;
   generating a feedback analog signal having an amplitude related to the first digital signal;
   combining said feedback analog signal with the analog signal applied to the system input to reduce the offset present in the output digital signal;
   applying signal ground to the system input and operating the system to generate a digital signal representative of remaining system offset; and
   varying said first digital signal in response to said digital signal representative of remaining system offset to further reduce system offset.

2. The method of claim 1 further comprising:
   applying the analog signal input to the input of said system and operating the system to generate a digital signal representative of the analog signal input; and
   subtracting the digital signal representative of the remaining system offset from the digital signal representative of the analog signal input to generate the system digital output.

3. The method of claim 2 wherein said digital signal representative of the analog signal input is generated prior to generating the digital signal representative of remaining system offset.

4. The method of claim 1 further comprising applying the analog signal input to the input of said system and operating the system to generate the system digital output signal.

5. The method of claims 1, 2, 3 or 4 wherein said conversion system comprises a variable gain amplifier, a sample and hold circuit connected to the output of said amplifier and an analog to digital converter connected to the output of said sample and hold circuit.

6. Apparatus for reducing offset error in a conversion system for generating an output digital signal representative of an analog signal applied to the input of said system comprising:
   a counter for storing a first digital word representative of the offset in the system;

a digital to analog converter responsive to the output of said counter for generating a feedback analog signal having an amplitude related to said first digital word;

means for combining the feedback analog signal with the analog signal applied to the system input to reduce the offset present in the output digital signal;

means for selectively applying either the analog signal input or signal ground to the input of said system; and means responsive to a digital signal generated by said system while signal ground is applied to the input of said system for varying said first digital word to further reduce system offset.

7. The apparatus of claim 6 further comprising:

a register for storing a digital word generated by said system while the analog input signal is applied to the input of said system; and means for subtracting the digital signal generated by said system while signal ground is applied to the input of said system from the digital signal generated by said system while the analog input signal is applied to the input of said system.

8. The apparatus of claim 6 or 7 wherein said conversion system comprises a variable gain amplifier, a sample and hold circuit connected to the output of said amplifier, and an analog to digital converter connected to the output of said sample and hold circuit.

9. Apparatus for generating an output digital signal representative of the amplitude of an analog signal input comprising:

an amplifier;

a sample and hold circuit for taking a sample of the output signal from said amplifier at selected time intervals and holding said sample for a selected time;

an analog to digital converter circuit for converting the sampled analog signals to equivalent digital signals;

switching means for applying to the input of said amplifier, signals consisting of the analog signal input combined with an analog offset feedback signal, or signal ground combined with the analog offset feedback signal;

register means for storing a digital offset feedback signal;

a digital to analog converter circuit for converting the digital offset feedback signal to a substantially equivalent analog offset feedback signal; and means responsive to the output of said analog to digital converter for varying the digital offset feedback signal so as to reduce the offset error in the system.

10. Apparatus useful in reducing the offset error in a system employing an amplifier, a sample and hold circuit, and analog to digital converter circuit for generating a digital representation of an analog signal input, comprising:

a summing means wherein a first input signal is subtracted from a second input signal;

switching means for switching said second input signal between the analog signal input and signal ground;

up/down counter means;

a digital to analog converter means responsive to the digital signal in said up/down converter means for generating said first input signal; and means for varying the digital signal in said up/down counter in response to the digital output signal from the analog to digital converter during intervals when the switching means is connected to ground so as to reduce offset error in said system.

11. The apparatus of claim 10 further comprising register means for storing the output signal from said analog to digital converter means, and means for subtracting the digital signal generated by said analog to digital converter when said switching means is connected to signal ground from the digital signal generated by said analog to digital converter during times when said switching means is connected to the analog signal input.

* * * * *